US012811612B2

(12) United States Patent
Nishio

(10) Patent No.: US 12,811,612 B2
(45) Date of Patent: Nov. 24, 2026

(54) RADIO-FREQUENCY MODULE AND COMMUNICATION APPARATUS

(71) Applicant: Murata Manufacturing Co., Ltd., Nagaokakyo (JP)

(72) Inventor: Keisuke Nishio, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 388 days.

(21) Appl. No.: 18/426,396

(22) Filed: Jan. 30, 2024

(65) Prior Publication Data

US 2024/0259036 A1 Aug. 1, 2024

(30) Foreign Application Priority Data

Jan. 31, 2023 (JP) ................................ 2023-013083

(51) Int. Cl.
*H04B 1/00* (2006.01)
*H03H 1/00* (2006.01)

(52) U.S. Cl.
CPC ......... *H04B 1/0057* (2013.01); *H03H 1/0007* (2013.01)

(58) Field of Classification Search
CPC .......... H04B 1/0057; H04B 1/38; H04B 1/40; H04B 1/401; H04B 1/0458; H04B 1/16; H04B 1/58; H04B 2001/0408; H03H 1/0007
See application file for complete search history.

(56) References Cited

U.S. PATENT DOCUMENTS

2019/0273521 A1* 9/2019 Nishikawa ......... H03H 9/02952
2020/0136659 A1* 4/2020 Yamada ............... H04B 1/0078
2020/0219829 A1* 7/2020 Ogata ...................... H04B 1/38
2021/0006272 A1* 1/2021 Takeuchi ................. H04B 1/04
2021/0409051 A1* 12/2021 Tanaka ..................... H04B 1/16
2024/0048170 A1* 2/2024 Kim ......................... H04B 1/40
2024/0259036 A1* 8/2024 Nishio ..................... H04B 1/40

FOREIGN PATENT DOCUMENTS

JP 2006-333168 A 12/2006
JP 2020-102758 A 7/2020
WO 2020/262028 A1 12/2020

* cited by examiner

*Primary Examiner* — Md K Talukder
(74) *Attorney, Agent, or Firm* — XSENSUS LLP

(57) ABSTRACT

A radio-frequency module includes a mounting substrate having a first main surface, an electronic component, and a second receive filter. The electronic component includes a transmit filter and a first receive filter and is disposed on the first main surface of the mounting substrate. The second receive filter is stacked on the electronic component. The pass band of the transmit filter and that of the second receive filter do not exactly match each other. In a plan view in a thickness direction of the mounting substrate, a first region of the electronic component where the first receive filter is located overlaps or matches the second receive filter, and a second region of the electronic component where the transmit filter is located overlaps none of filters disposed on the first main surface of the mounting substrate.

20 Claims, 10 Drawing Sheets

RADIO-FREQUENCY MODULE AND COMMUNICATION APPARATUS

CROSS-REFERENCE TO RELATED APPLICATION

This application claims priority to Japanese Patent Application No. JP 2023-013083 filed on Jan. 31, 2023. The entire contents of the above-identified application, including the specification, drawings and claims, are incorporated herein by reference in their entirety.

BACKGROUND OF THE DISCLOSURE

1. Field of the Disclosure

The present disclosure relates to a radio-frequency module and a communication apparatus, and more particularly to a radio-frequency module and a communication apparatus each including a transmit filter and a receive filter.

2. Description of the Related Art

International Publication No. 2020/262028 discloses a radio-frequency module including plural filters. In this radio-frequency module, a first filter using a first communication band as the pass band and a second filter using a second communication band, which is different from the first communication band, as the pass band are stacked on each other. One type of a radio-frequency module including plural filters is a radio-frequency module including plural receive filters. Another type of a radio-frequency module including plural filters is a radio-frequency module including a receive filter and a transmit filter, such as a radio-frequency module including a duplexer, for example.

SUMMARY OF THE DISCLOSURE

In a radio-frequency module including a receive filter and a transmit filter, if the transmit filter and another filter are stacked on each other, as in the radio-frequency module disclosed in International Publication No. 2020/262028, the heat dissipation performance of the transmit filter may be degraded. In such a radio-frequency module, if the transmit filter and the receive filter are stacked on each other, the isolation between the transmit filter and the receive filter may be reduced.

The present disclosure relates to a radio-frequency module and a communication apparatus each including a transmit filter and a receive filter in which the heat dissipation performance of the transmit filter is less likely to be degraded and the isolation between the transmit filter and the receive filter is less likely to be reduced.

A radio-frequency module according to an aspect of the disclosure includes a mounting substrate, an electronic component, and a second receive filter. The mounting substrate has first and second main surfaces. The electronic component includes a transmit filter and a first receive filter. The electronic component is disposed on the first main surface of the mounting substrate. The second receive filter is stacked on the electronic component. The pass band of the transmit filter and that of the second receive filter do not exactly match each other. In a plan view in a thickness direction of the mounting substrate, a first region overlaps or matches the second receive filter. The first region is a region of the electronic component where the first receive filter is located. In a plan view in the thickness direction of the mounting substrate, a second region overlaps none of filters disposed on the first main surface of the mounting substrate. The second region is a region of the electronic component where the transmit filter is located.

A communication apparatus according to an aspect of the disclosure includes the radio-frequency module and a signal processing circuit. The signal processing circuit is connected to the radio-frequency module.

In a radio-frequency module or a communication apparatus according to an aspect of the disclosure, the heat dissipation performance of a transmit filter is less likely to be degraded and the isolation between the transmit filter and a receive filter is less likely to be reduced.

DESCRIPTION OF THE EMBODIMENTS

Radio-frequency modules and communication apparatuses according to embodiments will be described below with reference to the drawings. The individual drawings to be referred to in the following embodiments are only schematically represented, and the ratio of each of the size and the thickness of an element to that of another element does not necessarily reflect the actual ratio of these elements.

First Embodiment (1) Overall Configuration of Radio-Frequency Module

The configuration of a radio-frequency module 1 according to a first embodiment will be described below with reference to FIGS. 1 through 3.

Figure 3:
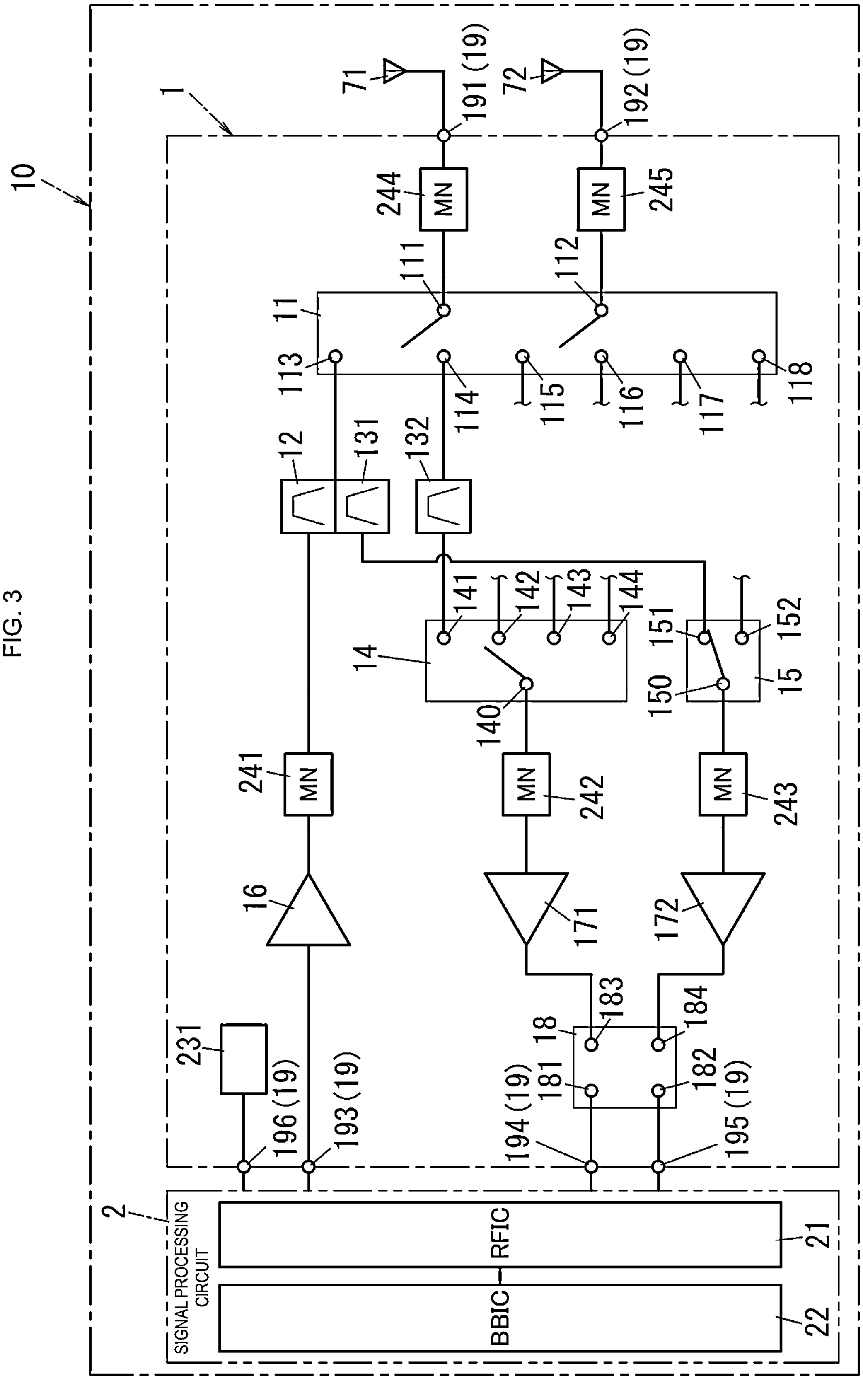
FIG. 3 is a circuit diagram of a communication apparatus including the radio-frequency module according to the first embodiment.

The radio-frequency module 1 is used in a communication apparatus 10, for example, as illustrated in FIG. 3. The communication apparatus 10 is a mobile phone, such as a smartphone, for example. The communication apparatus 10 is not restricted to a mobile phone and may be a wearable terminal, such as a smartwatch. The radio-frequency module 1 is a circuit that supports 4G (fourth-generation mobile communication) standards and 5G (fifth-generation mobile communication) standards, for example. 4G is 3GPP (registered trademark, Third Generation Partnership Project) LTE (registered trademark, Long Term Evolution) standards, for example. 5G is 5G NR (New Radio), for example.

The radio-frequency module 1 is a module that supports carrier aggregation and dual connectivity, for example. Carrier aggregation and dual connectivity are technologies used for communication utilizing radio waves of multiple frequency bands at the same time.

The communication apparatus 10 performs communication using multiple communication bands. More specifically, the communication apparatus 10 sends a transmission signal of a certain communication band and receives reception signals of multiple communication bands. To put it more precisely, the radio-frequency module 1 receives a reception signal of communication band B1 and a reception signal of communication band B3. The radio-frequency module 1 sends a transmission signal of communication band B1.

The communication apparatus 10 sends a transmission signal of one communication band and receives a reception signal of another communication band at the same time. More specifically, the radio-frequency module 1 sends a transmission signal of communication band B1 and receives a reception signal of communication band B1 at the same time.

Some transmission signals and some reception signals of multiple communication bands are FDD (Frequency Division Duplex) signals, for example. However, the transmission signals and reception signals of multiple communication bands are not restricted to FDD signals and may be TDD (Time Division Duplex) signals, for example. FDD is a radio communication technology in which transmission and reception in radio communication are performed by the allocation of different frequency bands to transmission and reception. TDD is a radio communication technology in which transmission and reception in radio communication are performed by using the same frequency band and by switching between transmission and reception in different time slots.

(2) Circuit Configuration of Radio-Frequency Module

The circuit configuration of the radio-frequency module 1 will be discussed below with reference to FIG. 3.

As illustrated in FIG. 3, the radio-frequency module 1 according to the first embodiment includes a first switch 11, a transmit filter 12, a first receive filter 131, a second receive filter 132, and a second switch 14. The radio-frequency module 1 also includes matching circuits 241, 242, 243, 244, and 245, a power amplifier 16, and low-noise amplifiers 171 and 172. The radio-frequency module 1 also includes, a third switch 15, a fourth switch 18, a controller 231, and plural (six in the example in FIG. 3) external connection terminals 19. The plural external connection terminals 19 include antenna terminals 191 and 192, an input terminal 193, a first output terminal 194, and a second output terminal 195.

(2.1) Transmit Filter and Receive Filter

The transmit filter 12 is a filter that allows a signal of the transmit band of communication band B1 to pass therethrough. Communication band B1 is n5 of 5G NR standards, for example. That is, the transmit filter 12 allows a transmission signal of n5 of 5G NR standards to pass therethrough. The transmit filter 12 may be designed to allow a transmission signal of Band 26 of 3GPP LTE standards to pass therethrough. The frequency range of transmission signals of Band 26 of 3GPP LTE standards cover the entire frequency range of transmission signals of n5 of 5G NR standards. Accordingly, a filter that allows a transmission signal of Band 26 of 3GPP LTE standards to pass therethrough can be used as a filter that allows a transmission signal of n5 of 5G NR standards to pass therethrough.

The first receive filter 131 is a filter that allows a signal of the receive band of a communication band to pass therethrough. The second receive filter 132 is a filter that allows a signal of the receive band of another communication band to pass therethrough. That is, the communication band of the first receive filter 131 and that of the second receive filter 132 are different from each other.

The first receive filter 131 is a filter that allows a signal of the receive band of communication band B1 to pass therethrough. That is, the first receive filter 131 allows a reception signal of n5 of 5G NR standards, for example, to pass therethrough. The first receive filter 131 may be designed to allow a reception signal of Band 26 of 3GPP LTE standards, for example, to pass therethrough. The frequency range of reception signals of Band 26 of 3GPP LTE standards cover the entire frequency range of reception signals of n5 of 5G NR standards. Accordingly, a filter that allows a reception signal of Band 26 of 3GPP LTE standards to pass therethrough can be used as a filter that allows a reception signal of n5 of 5G NR standards to pass therethrough.

The second receive filter 132 is a filter that allows a signal of the receive band of communication band B3 to pass therethrough. A reception signal of communication band B3 is Band 71 of 3GPP LTE standards, for example. That is, the second receive filter 132 allows a reception signal of Band 71 of 3GPP LTE standards to pass therethrough.

The pass band of the transmit filter 12 and that of the second receive filter 132 do not exactly match each other. "The pass band of the transmit filter 12 and that of the second receive filter 132 do not exactly match each other" means that the pass band of the transmit filter 12 and that of the second receive filter 132 are not exactly the same. More specifically, the pass band of the second receive filter 132 includes a frequency that is not included in the pass band of the transmit filter 12, while the pass band of the transmit filter 12 includes a frequency that is not included in the pass band of the second receive filter 132. In other words, there is a signal that passes through the transmit filter 12 and does not pass through the second receive filter 132, and there is also a signal that passes through the second receive filter 132 and does not pass through the transmit filter 12.

Each of the transmit filter 12 and the first and second receive filters 131 and 132 is, for example, an acoustic wave filter including one or more acoustic wave resonators.

(2.2) First Switch

The first switch 11 is a switch that connects one of the transmit filter 11 and the first and second receive filters 131 and 132 to the antenna terminal 191 and another one of the transmit filter 11 and the first and second receive filters 131 and 132 to the antenna terminal 192. The first switch 11 has common terminals 111 and 112 and plural (six in the example in FIG. 3) selection terminals 113 through 118.

The common terminal 111 is connected to the antenna terminal 191. The common terminal 112 is connected to the antenna terminal 192. The selection terminal 113 is connected to the transmit filter 12 and the first receive filter 131. The selection terminal 114 is connected to the second receive filter 132. Each of the selection terminals 115 through 118 is connected to a corresponding receive filter (not shown) or a ground.

The first switch 11 can connect each of the common terminals 111 and 112 to one of the selection terminals 113 through 118, for example.

(2.3) Power Amplifier

The power amplifier 16 is an amplifier that amplifies a transmission signal. The power amplifier 16 is disposed between the input terminal 193 and the transmit filter 12.

The power amplifier 16 has an input terminal (not shown) and an output terminal (not shown). The input terminal of the power amplifier 16 is connected to an external circuit (such as a signal processing circuit 2) via the input terminal 193. The output terminal of the power amplifier 16 is connected to the transmit filter 12. The power amplifier 16 is controlled by the controller 231, for example.

(2.4) Low-Noise Amplifier

Each of the low-noise amplifiers 171 and 172 is an amplifier that amplifies a reception signal while regulating noise to a low level.

Each of the low-noise amplifiers 171 and 172 has an input terminal (not shown) and an output terminal (not shown). The input terminal of the low-noise amplifier 171 is connected to the first receive filter 131. The output terminal of the low-noise amplifier 171 is connected to the first output terminal 194. The input terminal of the low-noise amplifier 172 is connected to the second receive filter 132. The output terminal of the low-noise amplifier 172 is connected to the second output terminal 195.

(2.5) Second Switch

The second switch 14 is a switch that connects one of the plural receive filters to the low-noise amplifier 171. The second switch 14 has a common terminal 140 and plural (four in the example in FIG. 3) selection terminals 141 through 144.

The common terminal 140 is connected to the low-noise amplifier 171. The selection terminal 141 is connected to the second receive filter 132. Each of the selection terminals 142 and 144 is connected to a corresponding receive filter (not shown) or a ground.

The second switch 14 can connect the common terminal 140 to one of the selection terminals 141 through 144, for example.

(2.6) Third Switch

The third switch 15 is a switch that connects one of the plural receive filters to the low-noise amplifier 172. The third switch 15 has a common terminal 150 and plural (two in the example in FIG. 3) selection terminals 151 and 152.

The common terminal 150 is connected to the low-noise amplifier 172. The selection terminal 151 is connected to the first receive filter 131. The selection terminal 152 is connected to a receive filter (not shown) or a ground.

The third switch 15 can connect the common terminal 150 to one of the selection terminals 151 and 152, for example.

(2.7) Fourth Switch

The fourth switch 18 is a switch that switches a path to connect to the first output terminal 194 and also switches a path to connect to the second output terminal 195. The fourth switch 18 has common terminals 181 and 182 and plural (two in the example in FIG. 3) selection terminals 183 and 184.

The common terminal 181 is connected to the first output terminal 194. The common terminal 182 is connected to the second output terminal 195. The selection terminal 183 is connected to the low-noise amplifier 171. The selection terminal 184 is connected to the low-noise amplifier 172.

Although the connection mode of the fourth switch 18 is not shown in FIG. 3, the fourth switch 18 can connect the common terminal 181 to one of the selection terminals 183 and 184, for example, and the fourth switch 18 can connect the common terminal 182 to one of the selection terminals 183 and 184, for example.

(2.8) Matching Circuit

The matching circuit 241 is disposed between the transmit filter 12 and the power amplifier 16. The matching circuit 241 is a circuit that performs impedance matching between the input terminal (not shown) of the transmit filter 12 and the output terminal of the power amplifier 16.

The matching circuit 242 is disposed between the second switch 14 and the low-noise amplifier 171. The matching circuit 242 is a circuit that performs impedance matching between the common terminal 140 of the second switch 14 and the input terminal of the low-noise amplifier 171.

The matching circuit 243 is disposed between the third switch 15 and the low-noise amplifier 172. The matching circuit 243 is a circuit that performs impedance matching between the common terminal 150 of the third switch 15 and the input terminal of the low-noise amplifier 172.

The matching circuit 244 is disposed between the antenna terminal 191 and the common terminal 111 of the first switch 11. The matching circuit 244 is a circuit that performs impedance matching between an antenna 71 connected to the antenna terminal 191 and the common terminal 111 of the first switch 11.

The matching circuit 245 is disposed between the antenna terminal 192 and the common terminal 112 of the first switch 11. The matching circuit 245 is a circuit that performs impedance matching between an antenna 72 connected to the antenna terminal 192 and the common terminal 112 of the first switch 11.

Each of the matching circuits 241 through 245 includes at least one of an inductor and a capacitor, for example.

(2.9) Controller

The controller 231 is a control circuit that has a function of controlling the power amplifier 16, the low-noise amplifier 171 and 172, and plural switches, such as the first switch 11. The controller 231 is connected to a control terminal 196. The controller 231 controls an individual semiconductor element in accordance with a control signal output from an external circuit (such as the signal processing circuit 2) connected to the control terminal 196.

(2.10) External Connection Terminal

The plural external connection terminals 19 are terminals for electrically connecting the radio-frequency module 1 to external circuits (such as the signal processing circuit 2). The plural external connection terminals 19 include the antenna terminals 191 and 192, input terminal 193, first and second output terminals 194 and 195, control terminal 196, and plural ground terminals (not shown).

The antenna 71 is connected to the antenna terminal 191. In the radio-frequency module 1, the antenna terminal 191 is connected to one of the filters via the first switch 111.

The antenna 72 is connected to the antenna terminal 192. In the radio-frequency module 1, the antenna terminal 192 is connected to one of the filters via the first switch 111.

The input terminal 193 is a terminal for inputting a transmission signal from an external circuit (such as the signal processing circuit 2) into the radio-frequency module 1. In the radio-frequency module 1, the input terminal 193 is connected to the input terminal of the power amplifier 16.

The first output terminal 194 is a terminal for outputting a reception signal from the radio-frequency module 1 to an external circuit (such as the signal processing circuit 2). In the radio-frequency module 1, the first output terminal 194 is connected to the output terminal of the low-noise amplifier 171 or 172.

The second output terminal 195 is a terminal for outputting a reception signal from the radio-frequency module 1 to an external circuit (such as the signal processing circuit 2).

In the radio-frequency module 1, the second output terminal 195 is connected to the output terminal of the low-noise amplifier 171 or 172.

The control terminal 196 is a terminal for inputting a control signal from an external circuit (such as the signal processing circuit 2) into the radio-frequency module 1. In the radio-frequency module 1, the control terminal 196 is connected to the input terminal (not shown) of the controller 231.

Plural ground terminals are electrically connected to ground electrodes on an external substrate (not shown) included in the communication apparatus 10 and receive a ground potential. In the radio-frequency module 1, the ground terminals are connected to a ground layer (not shown) of a mounting substrate 3 (see FIG. 1). The ground layer is a circuit ground of the radio-frequency module 1.

(3) Structure of Radio-Frequency Module

The structure of the radio-frequency module 1 according to the first embodiment will now be discussed below with reference to FIGS. 1 and 2.

Figure 1:
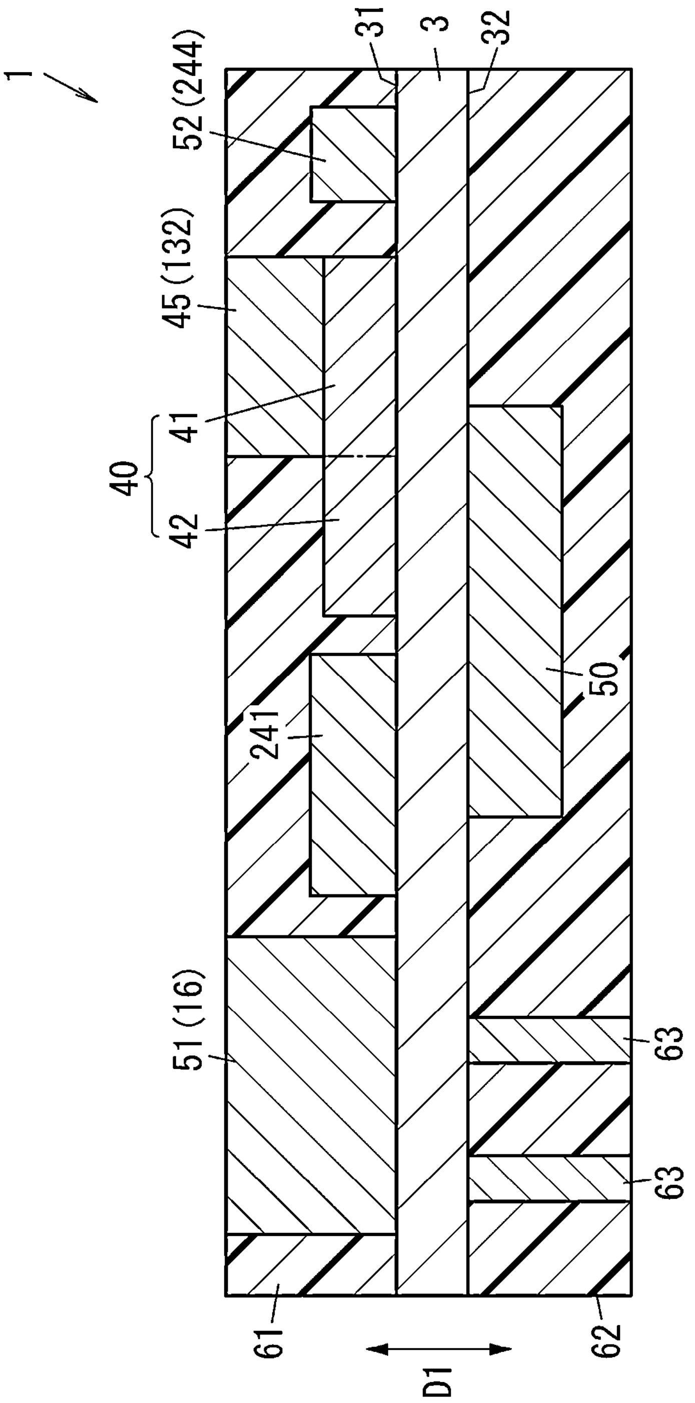
FIG. 1 is a sectional view of a radio-frequency module according to a first embodiment.

As illustrated in FIG. 1, the radio-frequency module 1 includes a mounting substrate 3, a first electronic component 40, electronic components 45, 50, 51, and 52, and external connection terminals 19 (not shown). As shown in FIG. 1, the radio-frequency module 1 includes resin layers 61 and 62, heat dissipation vias 63, and shield electrodes (not shown).

The radio-frequency module 1 is electrically connected to an external substrate (not shown). The external substrate is, for example, a mother substrate of the communication apparatus 10 (see FIG. 3), which is a mobile phone or communication equipment, for example.

(3.1) Mounting Substrate

As illustrated in FIG. 1, the mounting substrate 3 has first and second main surfaces 31 and 32. The first and second main surfaces 31 and 32 face each other in a thickness direction D1 (hereinafter may also be called the first direction D1) of the mounting substrate 3. Based on the radio-frequency module 1 being mounted on the external substrate, the second main surface 32 faces the main surface of the external substrate on the side close to the mounting substrate 3. The mounting substrate 3 is a double-sided mounting substrate. More specifically, on the first main surface 31, the first electronic component 40, the electronic components 45 and 51, and plural electronic components 52 (only one is shown in FIG. 1) are mounted. On the second main surface 32, the electronic component 50 is mounted.

The mounting substrate 3 is a multilayer substrate constituted by plural dielectric layers stacked on each other. The mounting substrate 3 includes plural conductive layers and plural via-conductors (including through-electrodes). The plural conductive layers include a ground layer maintained at a ground potential. The plural via-conductors are used for electrically connecting elements (including the above-described first electronic component 40 and electronic components 45, 50, 51, and 52) mounted on the first and second main surfaces 31 and 32 to the conductive layers of the mounting substrate 3.

(3.2) Electronic Component

The first electronic component 40 is disposed on the first main surface 31 of the mounting substrate 3, as shown in FIG. 1. The first electronic component 40 includes the transmit filter 12 and the first receive filter 131, as shown in FIG. 2.

Figure 2:
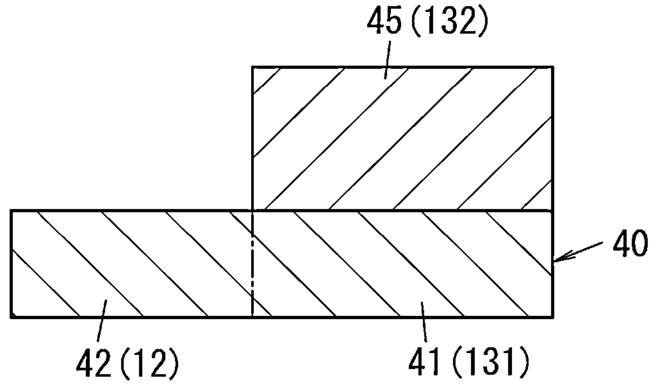
FIG. 2 is an enlarged sectional view of first and second electronic components included in the radio-frequency module according to the first embodiment.

As illustrated in FIG. 2, the first electronic component 40 has a first region 41 including the first receive filter 131 and a second region 42 including the transmit filter 12. In the first electronic component 40, the first region 41 and the second region 42 does not overlap each other. The transmit filter 12 is not included in the first region 41, while the first receive filter 131 is not included in the second region 42.

As shown in FIGS. 1 and 2, on the first main surface 31 of the mounting substrate 3, the electronic component 45 is stacked on the first electronic component 40. More specifically, the electronic component 45 is disposed on the first region 41 of the first electronic component 40. In other words, the second receive filter 132 is stacked on the first electronic component 40. The meaning of "the second receive filter 132 is stacked on the first electronic component 40" includes a state in which the electronic component 45 including the second receive filter 132 is in contact with the first electronic component 40 and is also arranged together with the first electronic component 40 along the first direction D1.

In a plan view in the first direction D1, the electronic component 45 overlaps or matches the first region 41 of the first electronic component 40. In other words, in a plan view in the first direction D1, the second receive filter 132 overlaps or matches the first region 41 of the first electronic component 40. More specifically, in a plan view in the first direction D1, the electronic component 45 is disposed within the entirety or part of the first region 41 of the first electronic component 40.

In a plan view in the first direction D1, the electronic component 45 does not overlap the second region 42 of the first electronic component 40. In other words, in a plan view in the first direction D1, the second region 42 of the first electronic component 40 overlaps none of the filters disposed on the first main surface 31 of the mounting substrate 3. In the radio-frequency module 1, there is a space close to the first main surface 31 and a space close to the second main surface 32 with the mounting substrate 3 interposed therebetween. "The filters disposed on the first main surface 31 of the mounting substrate 3" are filters disposed in the space close to the first main surface 31. That is, no filter is stacked on the second region 42 of the first electronic component 40.

Each of the transmit filter 12 and the first and second receive filters 131 and 132 is, for example, an acoustic wave filter including plural series arm resonators and plural parallel arm resonators. The acoustic wave filter is a surface acoustic wave (SAW) filter utilizing surface acoustic waves, for example. Each of the transmit filter 12 and the first and second receive filters 131 and 132 may also include at least one of an inductor and a capacitor connected in series with any of the plural series arm resonators. Each of the transmit filter 12 and the first and second receive filters 131 and 132 may include an inductor or a capacitor connected in series with any of the plural parallel arm resonators.

The electronic component 50 is disposed on the second main surface 32 of the mounting substrate 3, as shown in FIG. 1. The electronic component 50 includes the low-noise amplifiers 171 and 172, first switch 11, second switch 14, third switch 15, and fourth switch 18. On the second main surface 32 of the mounting substrate 3, another electronic component (not shown) including the controller 231 may be disposed.

The electronic component 51 is disposed on the first main surface 31 of the mounting substrate 3, as shown in FIG. 1. The electronic component 51 includes the power amplifier 16.

The plural electronic components 52 (only one is shown in FIG. 1) are each disposed on the first main surface 31 of the mounting substrate 3. The respective electronic components 52 include the matching circuits 241, 242, 243, 244, and 245. The electronic component 52 shown in FIG. 1 includes the matching circuit 244.

(3.3) Resin Layer, Shield Electrode, and Heat Dissipation Via

As illustrated in FIG. 1, the resin layer 61 covers the first electronic component 40 and the electronic components 45, 51, and 52 and the first main surface 31 of the mounting substrate 3.

The resin layer 62 covers the electronic component 50 and the second main surface 32 of the mounting substrate 3, as shown in FIG. 1.

The shield electrodes (not shown) cover at least part of the resin layers 61 and 62.

The plural heat dissipation vias 63 are provided on the second main surface 32 of the mounting substrate 3. In a plan view in the first direction D1, each of the heat dissipation vias 63 overlaps the electronic component 51. The heat dissipation vias 63 are heat transfer members for dissipating heat generated in the power amplifier 16 to the external substrate (not shown).

(4) Communication Apparatus

As illustrated in FIG. 3, the communication apparatus 10 includes the radio-frequency module 1, the signal processing circuit 2, and the antennas 71 and 72. The communication apparatus 10 also includes the external substrate (not shown) on which the radio-frequency module 1 is mounted. The external substrate is a printed wiring board, for example. The external substrate includes ground electrodes to which a ground potential is supplied.

(4.1) Antenna

As shown in FIG. 3, the antenna 71 is connected to the antenna terminal 191 of the radio-frequency module 1, and the antenna 72 is connected to the antenna terminal 192 of the radio-frequency module 1. The antennas 71 and 72 each have a sending function of radiating a transmission signal output from the radio-frequency module 1 as a radio wave and a receiving function of receiving a reception signal from an external source as a radio wave and outputting the reception signal to the radio-frequency module 1.

(4.2) Signal Processing Circuit

As illustrated in FIG. 3, the signal processing circuit 2 includes an RF signal processing circuit 21 and a baseband signal processing circuit 22. The signal processing circuit 2 processes a signal which is to pass through the radio-frequency module 1 and a signal which has passed through the radio-frequency module 1. More specifically, the signal processing circuit 2 processes a transmission signal and a reception signal.

The RF signal processing circuit 21 is a radio frequency integrated circuit (RFIC), for example. The RF signal processing circuit 21 performs signal processing on a radio-frequency signal.

The RF signal processing circuit 21 performs signal processing, such as up-conversion, on a transmission signal output from the baseband signal processing circuit 22 and outputs the processed transmission signal to the radio-frequency module 1. The RF signal processing circuit 21 also performs signal processing, such as down-conversion, on a reception signal output from the radio-frequency module 1 and outputs the processed reception signal to the baseband signal processing circuit 22.

The baseband signal processing circuit 22 is a baseband integrated circuit (BBIC), for example. The baseband signal processing circuit 22 performs predetermined signal processing on a transmission signal output from the outside of the signal processing circuit 2. A reception signal processed by the baseband signal processing circuit 22 is used as an image signal for displaying an image or an audio signal for performing speech communication, for example.

The RF signal processing circuit 21 also serves as a control unit that controls, via the controller 231, the connection states of the first switch 11, second switch 14, third switch 15, and fourth switch 18 of the radio-frequency module 1, in response to sending and receiving of radio-frequency signals (transmission signal and reception signal). More specifically, the RF signal processing circuit 21 switches the connection state of each of the first switch 11, second switch 14, third switch 15, and fourth switch 18. The control unit may be disposed outside the RF signal processing circuit 21. For example, the control unit may be disposed in the radio-frequency module 1 or the baseband signal processing circuit 22.

A radio-frequency module 1 according to the first embodiment includes a mounting substrate 3, a first electronic component 40, and an electronic component 45. The mounting substrate 3 has first and second main surfaces 31 and 32. The first electronic component 40 includes a transmit filter 12 and a first receive filter 131. The first electronic component 40 is disposed on the first main surface 31 of the mounting substrate 3. The electronic component 45 includes a second receive filter 132 and is stacked on the first electronic component 40. The pass band of the transmit filter 12 and that of the second receive filter 132 do not exactly match each other. In a plan view in a first direction D1, which is the thickness direction of the mounting substrate 3, a first region 41 of the first electronic component 40 where the first receive filter 131 is located overlaps or matches the electronic component 45 including the second receive filter 132. In a plan view in the first direction D1, which is the thickness direction of the mounting substrate 3, a second region 42 of the first electronic component 40 where the transmit filter 12 is located overlaps none of filters disposed on the first main surface 31 of the mounting substrate 3.

In the radio-frequency module 1, in a plan view in the first direction D1, the transmit filter 12 and the second receive filter 132 do not overlap each other. It is thus possible to reduce electromagnetic coupling between the transmit filter 12 and the second receive filter 132 in the radio-frequency module 1. A transmission signal passing through the transmit filter 12 is thus less likely to leak to the receive path via the second receive filter 132. This makes it less likely to degrade the reception sensitivity in the receive path including the second receive filter 132. In the radio-frequency module 1, in a plan view in the first direction D1, the transmit filter 12 overlaps none of the filters disposed on the first main surface 31 of the mounting substrate 3. The transmit filter 12 generates heat because it allows a high-power transmission signal to pass therethrough. In the radio-frequency module 1, since no filter is disposed on the transmit filter 12, the heat dissipation performance of the transmit filter 12 is enhanced. Additionally, in the radio-frequency module 1, a temperature change of the second receive filter 132, which would be caused by heat dissipation of the transmit filter 12, is less likely to occur. This can reduce variations in the bandpass characteristics of the second receive filter 132 for signals, which would be caused by a temperature change of the second receive filter 132.

Second Embodiment

Figure 4:
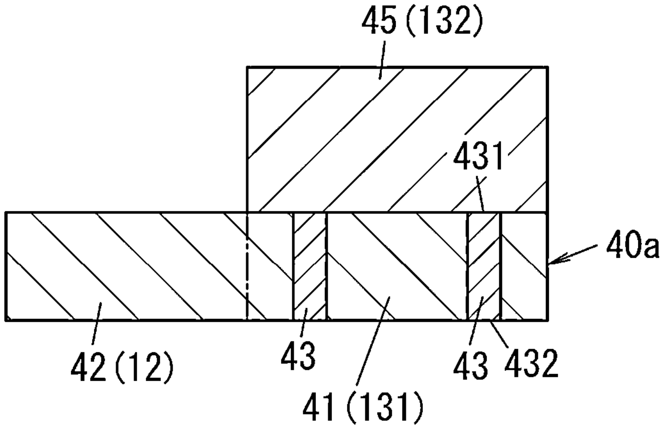
FIG. 4 is an enlarged sectional view of first and second electronic components included in a radio-frequency module according to a second embodiment.

As illustrated in FIG. 4, a radio-frequency module 1 according to a second embodiment includes a first electronic component 40*a* instead of the first electronic component 40. The first electronic component 40*a* includes plural (two in FIG. 4) through-vias 43.

The first electronic component 40*a* has the through-vias 43 in the first region 41 including the first receive filter 131. The through-vias 43 pass through the first electronic component 40*a* in the first direction D1 (see FIG. 1). More specifically, the through-vias 43 each have a conductive member, such as copper or silver, provided inside of or on the inner wall of the corresponding through-via 43, and a first end 431 of each of the through-vias 43 is connected to a bump electrode, for example, provided for the electronic component 45 on the side close to the first end 431. A second end 432 of each of the through-vias 43 faces the first main surface 31 (see FIG. 1) of the mounting substrate 3 and is connected to the corresponding through-via 43 and the mounting substrate 3 or the first receive filter 131 of the first electronic component 40*a*. For example, a bump electrode for electrically connecting the mounting substrate 3 and the first receive filter 131 to each other is disposed at the second end 432 or at another position of each of the through-vias 43.

The through-vias 43 are formed with a laser, for example, in a substrate of the first electronic component 40*a* where the first receive filter 131 is located.

In the radio-frequency module 1 according to the second embodiment, the through-vias 43 of the first electronic component 40*a* can be used for connecting the electronic component 45 and the first main surface 31 of the mounting substrate 3 to each other. This can reduce the length of the path between the electronic component 45 and another electronic component to be connected to the electronic component 45. Impedance mismatching between the electronic component 45 and another electronic component to be connected to each other is thus less likely to occur. As a result, the insertion loss of the second receive filter 132 is less likely to increase or the attenuation characteristics of the second receive filter 132 for a signal in the elimination band are less likely to be degraded.

In the radio-frequency module 1 according to the second embodiment, the through-vias 43 of the first electronic component 40*a* may be used for connecting the electronic component 45 and the first electronic component 40*a* to each other. In this case, too, it is less likely to increase the insertion loss of the second receive filter 132 or to degrade the attenuation characteristics of the second receive filter 132 for a signal in the elimination band, as stated above.

Third Embodiment

A radio-frequency module 1*a* according to a third embodiment will be described below with reference to FIGS. 5 and 6. Elements of the radio-frequency module 1*a* of the third embodiment similar to those of the radio-frequency module 1 of the first embodiment are designated by like reference numerals and an explanation thereof will be omitted.

(1) Circuit Configuration of Radio-Frequency Module

Figure 6:
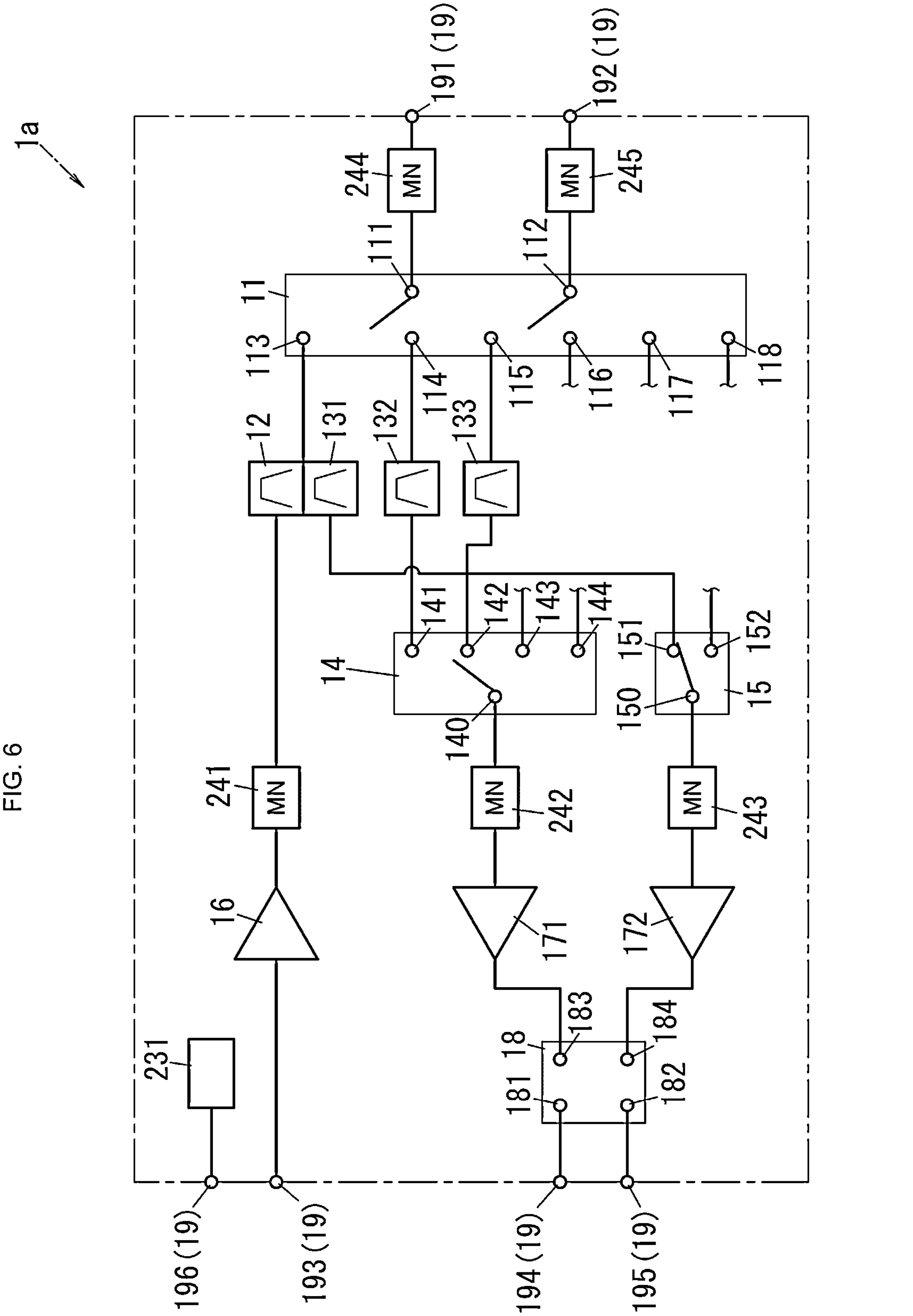
FIG. 6 is a circuit diagram of the radio-frequency module according to the third embodiment.

As illustrated in FIG. 6, the radio-frequency module 1*a* according to the third embodiment includes a third receive filter 133 in addition to the elements of the radio-frequency module 1 shown in FIG. 3.

The third receive filter 133 is a filter that allows a signal of the receive band of communication band B2 to pass therethrough. The radio-frequency module 1*a* is able to perform simultaneous communication using a signal of communication band B1 passing through the transmit filter 12 of the first electronic component 40 (see FIG. 5) and a signal of communication band B2 passing through the third receive filter 133. More specifically, the radio-frequency module 1*a* can send a signal of the transmit band of communication band B1 and receive a signal of the receive band of communication band B2 at the same time. Communication band B2 is Band 12 of 3GPP LTE standards, for example. The radio-frequency module 1*a* does not perform sending of a signal of the transmit band of communication band B1 and receiving of a signal of the receive band of communication band B3 at the same time. That is, the radio-frequency module 1*a* does not perform simultaneous communication using a signal of communication band B1 passing through the transmit filter 12 and a signal of communication band B3 passing through the second receive filter 132.

The third receive filter 133 is an acoustic wave filter including one or more acoustic wave resonators, for example.

The third receive filter 133 is connected to the selection terminal 115 of the first switch 11. That is, the third receive filter 133 can connect to the antenna 71 or 72 via the first switch 11. The third receive filter 133 is also connected to the selection terminal 142 of the second switch 14. That is, the third receive filter 133 can connect to the low-noise amplifier 171 via the second switch 14.

(2) Structure of Radio-Frequency Module

Figure 5:
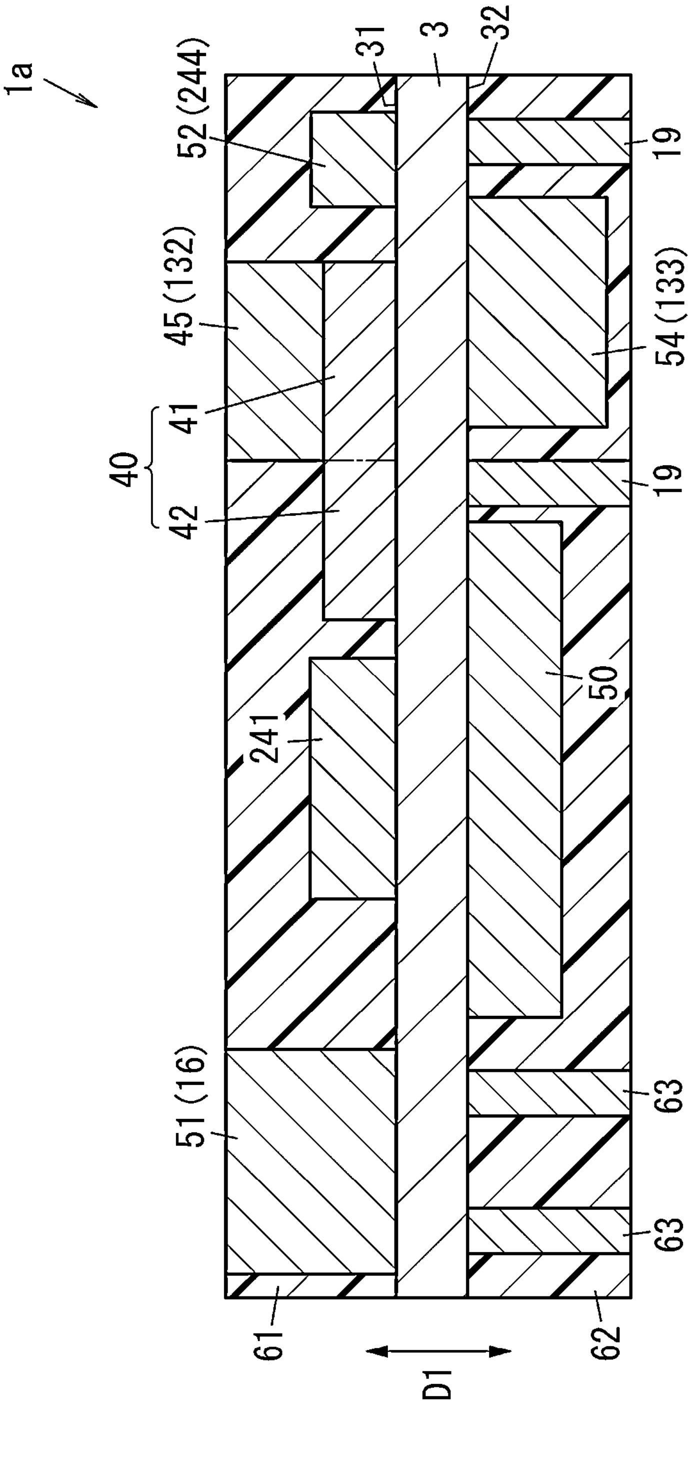
FIG. 5 is a sectional view of a radio-frequency module according to a third embodiment.

As illustrated in FIG. 5, the radio-frequency module 1*a* includes a second electronic component 54 in addition to the elements of the radio-frequency module 1 shown in FIG. 1.

The second electronic component 54 is disposed on the second main surface 32 of the mounting substrate 3, as shown in FIG. 5. The second electronic component 54 includes the third receive filter 133. That is, the third receive filter 133 is disposed on the second main surface 32 of the mounting substrate 3. In a plan view in the first direction D1, the second region 42 of the first electronic component 40 and the third receive filter 133 do not overlap each other.

A radio-frequency module 1*a* according to the third embodiment also includes a third receive filter 133. The radio-frequency module 1*a* is able to perform simultaneous communication using a transmission signal of communication band B1 which passes through the first electronic component 40 and a reception signal of communication band B2 which passes through the third receive filter 133. A second electronic component 54 including the third receive filter 133 is disposed on the second main surface 32 of the mounting substrate 3. That is, the mounting substrate 3 is interposed between the transmit filter 12 included in the first electronic component 40 and the third receive filter 133 included in the electronic component 54. This can reduce electromagnetic coupling between the transmit filter 12 and the third receive filter 133, thereby enhancing the isolation between the transmit filter 12 and the third receive filter 133.

In the radio-frequency module 1*a* according to the third embodiment, in a plan view in the first direction D1, the second region 42 of the first electronic component 40 and the third receive filter 133 do not overlap each other. This can further improve the isolation between the transmit filter 12 and the third receive filter 133.

This can also make it less likely to degrade the reception sensitivity in the receive path including the third receive filter 133.

The radio-frequency module 1*a* according to the third embodiment does not perform simultaneous communication using a signal of communication band B3 and a signal of communication band B1. Accordingly, upon the radio-frequency module 1*a* receiving a reception signal of communication band B3 by using the second receive filter 132, a transmission signal of communication band B1 does not pass through the transmit filter 12. This can make it less likely to degrade the reception sensitivity in the receive path including the second receive filter 132.

First Modified Example

Figure 7:
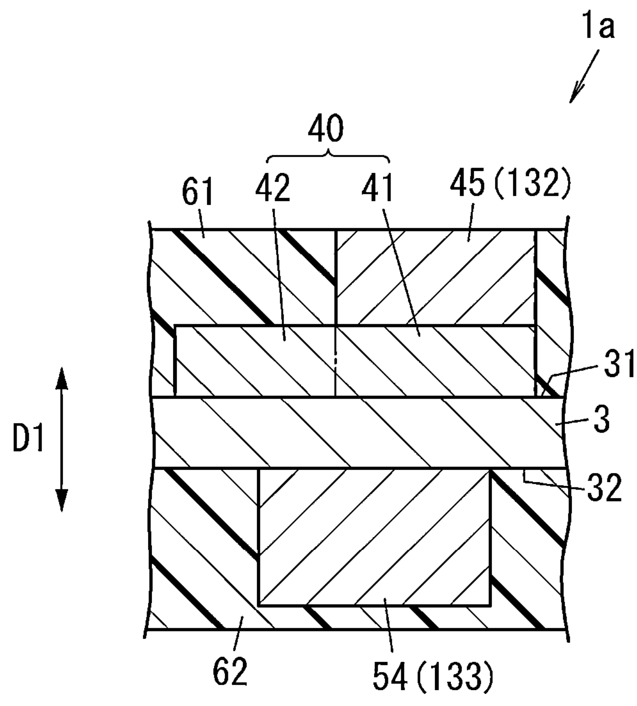
FIG. 7 is a sectional view of the major part of a radio-frequency module according to a first modified example of the third embodiment.

In a radio-frequency module 1*a* according to a first modified example of the third embodiment, as illustrated in FIG. 7, the second region 42 of the first electronic component 40 and the third receive filter 133 may overlap each other in a plan view in the first direction D1.

As discussed above, the radio-frequency module 1*a* performs sending of a signal of the transmit band of communication band B1 and receiving of a signal of the receive band of communication band B2 at the same time. That is, in the radio-frequency module 1*a*, a signal passes through the first electronic component 40 and a signal passes through the second electronic component 54 at the same time.

In the radio-frequency module 1*a* according to the first modified example of the third embodiment, as well as in the third embodiment, the mounting substrate 3 is interposed between the transmit filter 12 and the third receive filter 133. This can reduce electromagnetic coupling between the transmit filter 12 and the third receive filter 133, thereby enhancing the isolation between the transmit filter 12 and the third receive filter 133. This can make it even less likely to degrade the reception sensitivity in the receive path including the third receive filter 133.

Second Modified Example

Figure 8:
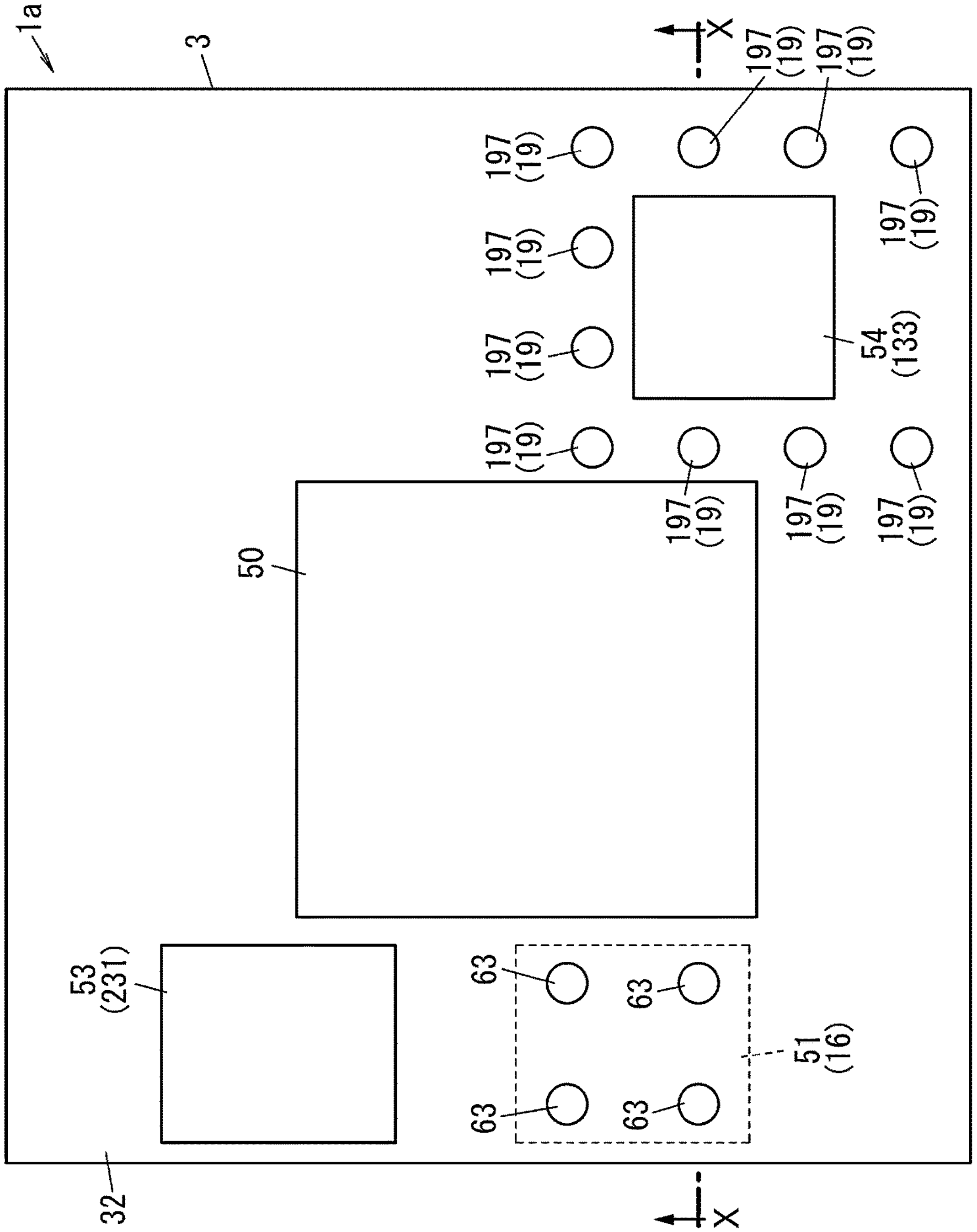
FIG. 8 is a plan view of a radio-frequency module according to a second modified example of the third embodiment.

In a radio-frequency module 1*a* according to a second modified example of the third embodiment, the external connection terminals 19 include plural shield members 197, as shown in FIG. 8. FIG. 8 is a plan view of a radio-frequency module 1*a* according to the second modified example of the third embodiment when the second main surface 32 of the mounting substrate 3 is seen in the first direction D1. In FIG. 8, an electronic component 53 including the controller 231 is disposed on the second main surface 32 of the mounting substrate 3. A cross section taken along line X-X in FIG. 8 corresponds to FIG. 5.

Each of the shield members 197 is a ground terminal connected to a ground. The shield members 197 are disposed substantially around the second electronic component 54. "The shield members 197 are disposed substantially around the second electronic component 54" means that the shield members 197 serve to divide the second main surface 32 of the mounting substrate 3 into the region where the second electronic component 54 is disposed and into other regions. More specifically, the shield members 197 are disposed between the second electronic component 54 and the other components disposed on the second main surface 32 of the mounting substrate 3.

In the radio-frequency module 1*a* according to the second modified example of the third embodiment, electromagnetic coupling between the transmit filter 12 and the third receive filter 133 can further be reduced, thereby further enhancing the isolation between the transmit filter 12 and the third receive filter 133. This can make it even less likely to degrade the reception sensitivity in the receive path including the third receive filter 133.

Fourth Embodiment

A radio-frequency module 1*b* according to a fourth embodiment will be described below with reference to FIG. 9. Elements of the radio-frequency module 1*b* of the fourth embodiment similar to those of the radio-frequency module 1 of the first embodiment are designated by like reference numerals and an explanation thereof will be omitted.

(1) Circuit Configuration of Radio-Frequency Module

Figure 9:
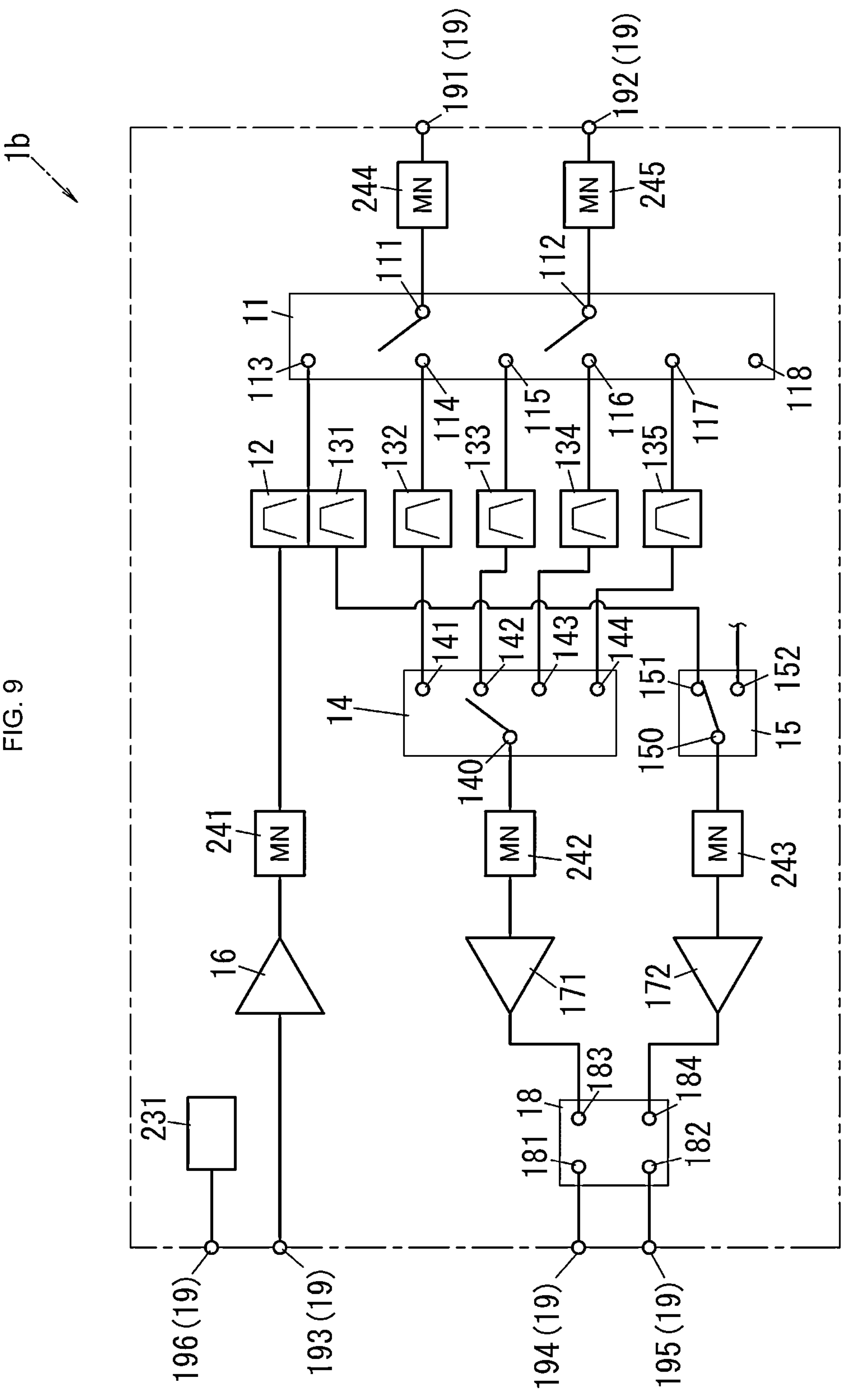
FIG. 9 is a circuit diagram of a radio-frequency module according to a fourth embodiment.

As illustrated in FIG. 9, the radio-frequency module 1*b* according to the fourth embodiment also includes third receive filters 134 and 135 in addition to the elements of the radio-frequency module 1*a* shown in FIG. 6. That is, the radio-frequency module 1*b* according to the fourth embodiment includes plural third receive filters.

The third receive filter 133 is a filter that allows a signal of the receive band of communication band B21 to pass therethrough. The radio-frequency module 1*b* performs sending of a signal of the transmit band of communication band B1 and receiving of a signal of the receive band of communication band B21 at the same time. Communication band B21 is Band 12 of 3GPP LTE standards, for example.

The third receive filter 133 is connected to the selection terminal 115 of the first switch 11. That is, the third receive filter 133 can connect to the antenna 71 or 72 via the first switch 11. The third receive filter 133 is also connected to the selection terminal 142 of the second switch 14. That is, the third receive filter 133 can connect to the low-noise amplifier 171 via the second switch 14.

The third receive filter 134 is a filter that allows a signal of the receive band of communication band B22 to pass therethrough. The radio-frequency module 1*b* performs sending of a signal of the transmit band of communication band B1 and receiving of a signal of the receive band of communication band B22 at the same time. Communication band B22 is a communication band different from communication band B21. Communication band B22 is Band 13 of 3GPP LTE standards, for example.

The third receive filter 134 is connected to the selection terminal 116 of the first switch 11. That is, the third receive filter 134 can connect to the antenna 71 or 72 via the first switch 11. The third receive filter 134 is also connected to the selection terminal 143 of the second switch 14. That is, the third receive filter 134 can connect to the low-noise amplifier 171 via the second switch 14.

The third receive filter 135 is a filter that allows a signal of the receive band of communication band B23 to pass therethrough. The radio-frequency module 1*b* performs sending of a signal of the transmit band of communication band B1 and receiving of a signal of the receive band of communication band B23 at the same time. Communication band B23 is a communication band different from communication band B21 and communication band B22. Communication band B23 is Band 14 of 3GPP LTE standards, for example.

The third receive filter 135 is connected to the selection terminal 117 of the first switch 11. That is, the third receive filter 135 can connect to the antenna 71 or 72 via the first switch 11. The third receive filter 135 is also connected to the selection terminal 144 of the second switch 14. That is, the third receive filter 135 can connect to the low-noise amplifier 171 via the second switch 14.

Each of the third receive filters 133, 134, and 135 is, for example, an acoustic wave filter including one or more acoustic wave resonators.

(2) Structure of Radio-Frequency Module

Figure 10:
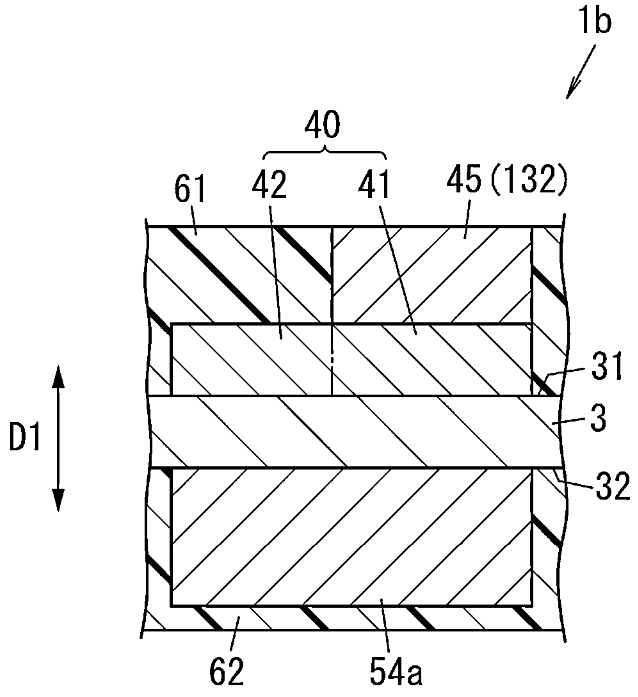
FIG. 10 is a sectional view of the major part of the radio-frequency module according to the fourth embodiment.

In the radio-frequency module 1*b*, as illustrated in FIG. 10, the first electronic component 40 and a second electronic component 54*a* overlap or match each other in a plan view in the first direction D1. The second electronic component 54*a*, which is disposed on the second main surface 32 of the mounting substrate 3, includes the third receive filters 133, 134, and 135 (see FIG. 9). That is, in a plan view in the first direction D1, the second region 42 of the first electronic component 40 overlaps or matches at least one of the third receive filters 133, 134, and 135.

The radio-frequency module 1*b* according to the fourth embodiment includes third receive filters 133, 134, and 135. The radio-frequency module 1*b* is able to perform simultaneous communication of a transmission signal of communication band B1 which passes through the first electronic component 40 and one of a reception signal of communication band B21 which passes through the third receive filter 133, a reception signal of communication band B22 which passes through the third receive filter 134, and a reception signal of communication band B23 which passes through the third receive filter 135. The second electronic component 54*a* includes the third receive filters 133, 134, and 135. This can reduce the size of the radio-frequency module 1*b*.

Modified Examples

Modified examples of the first through fourth embodiments will be described below.

The radio-frequency modules 1, 1*a*, and 1*b* according to the first through fourth embodiments include the transmit filter 12 as a transmit filter. However, this configuration is only an example. The radio-frequency modules 1, 1*a*, and 1*b* may include plural transmit filters. Based on the radio-frequency modules 1, 1*a*, and 1*b* including plural transmit filters, a transmit filter other than the transmit filter 12 disposed on the first main surface 31 of the mounting substrate 3 does not overlap the second region 42 of the first electronic component 40 in a plan view in the first direction D1. That is, in a plan view in the first direction D1, the second region 42 of the first electronic component 40 overlaps none of the filters disposed on the first main surface 31 of the mounting substrate 3.

The radio-frequency modules 1, 1*a*, and 1*b* include the power amplifier 16 as a power amplifier. However, this configuration is only an example. The radio-frequency modules 1, 1*a*, and 1*b* may include plural power amplifiers.

The radio-frequency modules 1 according to the first and second embodiments include the first and second receive filters 131 and 132 as receive filters. The radio-frequency module 1*a* according to the third embodiment also includes the third receive filter 133 as a receive filter. The radio-frequency module 1*b* according to the fourth embodiment also includes the third receive filters 134 and 135 as receive filters. However, this configuration is only an example. The radio-frequency modules 1, 1*a*, and 1*b* may also include another receive filter. A receive filter is connected between one of the selection terminals of the first switch 11 and one of the selection terminals of the second switch 14 or one of the selection terminals of the third switch 15, for example. In a plan view in the first direction D1, none of the receive filters disposed on the first main surface 31 of the mounting substrate 3 overlaps the second region 42 of the first electronic component 40. That is, in a plan view in the first direction D1, the second region 42 of the first electronic component 40 overlaps none of the filters disposed on the first main surface 31 of the mounting substrate 3.

The radio-frequency module 1*b* according to the fourth embodiment includes the third receive filters 133, 134, and 135 as third receive filters. However, this configuration is only an example. For instance, the radio-frequency module 1*b* may include only two receive filters or four or more receive filters as third receive filters. It is not necessary that the second electronic component 54*a* include all the third receive filters, and some of the receive filters, which are the third receive filters, may be disposed on the first main surface 31 of the mounting substrate 3 or be included in an electronic component other than the second electronic component 54*a*.

The mounting substrates 3 of the radio-frequency modules 1 according to the first and second embodiments are double-sided mounting substrates, and the electronic component 50 is disposed on the second main surface 32 of each of the mounting substrate 3. However, the radio-frequency modules 1 according to the first and second embodiments are not limited to this configuration. In one example, the electronic component 50 of the radio-frequency module 1 according to one of the first and second embodiments may be disposed on the first main surface 31 of the mounting substrate 3. In another example, the mounting substrates 3 may be single-sided mounting substrates, and the electronic components 50 of the radio-frequency modules 1 of both of the first and second embodiments may be each disposed on the first main surface 31 of the mounting substrate 3.

In the radio-frequency modules 1, 1*a*, and 1*b* according to the first through fourth embodiments, communication band B1 is n5 of 5G NR standards, while communication band B3 is Band 71 of 3GPP LTE standards. However, this is only an example. Any combination of bands may be used as communication band B1 and communication band B3 as long as the radio-frequency modules 1, 1*a*, and 1*b* do not perform sending of a transmission signal of communication band B1 and receiving of a reception signal of communication band B3 at the same time.

In the radio-frequency modules 1*a* and 1*b* according to the third and fourth embodiments, communication band B1 is n5 of 5G NR standards, while communication band B2 is Band 12 of 3GPP LTE standards. However, this is only an example. Any combination of bands may be used as communication band B1 and communication band B2 as long as the radio-frequency modules 1*a* and 1*b* perform sending of a transmission signal of communication band B1 and receiving of a reception signal of communication band B2 at the same time.

The radio-frequency modules 1, 1*a*, and 1*b* according to the first through fourth embodiments include the antenna terminals 191 and 192, which are connected to the antennas 71 and 72, respectively. However, this configuration is only an example. For instance, the radio-frequency module 1 may include only one antenna terminal, which may be connected to one antenna. The radio-frequency modules 1, 1*a*, and 1*b* may include three or more antenna terminals, which may be connected to the respective antennas.

In the radio-frequency module 1*a* according to the second modified example of the third embodiment, each of the plural shield members 197 is a ground terminal connected to a ground. However, this configuration is only an example. For instance, the radio-frequency module 1*a* may include a single shield member, which may be connected to the ground layer of the mounting substrate 3. The shield members may have a cylindrical shape or a planar shape, for example.

In the specification, the meaning of "an element is disposed on a first main surface of a substrate" includes, not only that the element is directly mounted on the first main surface of the substrate, but also that, regarding a space close to the first main surface and a space close to the second main surface with the substrate interposed therebetween, the element is disposed in the space close to the first main surface. That is, the meaning of "an element is disposed on a first main surface of a substrate" includes that the element is disposed on the first main surface of the substrate via another circuit element or another electrode, for example. The element is the first electronic component 40, for example, but is not restricted thereto. The substrate is the mounting substrate 3, for example. Considering the substrate to be the mounting substrate 3, the first main surface is the first main surface 31, and the second main surface is the second main surface 32.

In the specification, the meaning of "an element is disposed on a second main surface of a substrate" includes, not only that the element is directly mounted on the second main surface of the substrate, but also that, regarding a space close to the first main surface and a space close to the second main surface with the substrate interposed therebetween, the element is disposed in the space close to the second main surface. That is, the meaning of "an element is disposed on a second main surface of a substrate" includes that the element is disposed on the second main surface of the substrate via another circuit element or another electrode, for example. The element is the electronic component 50, for example, but is not restricted thereto. The substrate is the mounting substrate 3, for example. Considering the substrate to be the mounting substrate 3, the first main surface is the first main surface 31, and the second main surface is the second main surface 32.

(Aspects)

The following aspects are disclosed in the specification.

A radio-frequency module (1, 1*a*, 1*b*) according to a first aspect includes a mounting substrate (3), an electronic component (40, 40*a*), and a second receive filter (132). The mounting substrate (3) has a first main surface (31) and a second main surface (32). The electronic component (40, 40*a*) includes a transmit filter (12) and a first receive filter (131). The electronic component (40, 40*a*) is disposed on the first main surface (31) of the mounting substrate (3). The second receive filter (132) is stacked on the electronic component (40, 40*a*). The pass band of the transmit filter (12) and that of the second receive filter (132) do not exactly match each other. In a plan view in a thickness direction (D1) of the mounting substrate (3), a first region (41) overlaps or matches the second receive filter (132). The first region (41) is a region of the electronic component (40, 40*a*) where the first receive filter (131) is located. In a plan view in the thickness direction (D1) of the mounting substrate (3), a second region (42) overlaps none of filters disposed on the first main surface (31) of the mounting substrate (3). The second region (42) is a region of the electronic component (40, 40*a*) where the transmit filter (12) is located.

In the radio-frequency module (1, 1*a*, 1*b*) according to the first aspect, electromagnetic coupling between the transmit filter (12) and the second receive filter (132) can be reduced. This can make it less likely to degrade the reception sensitivity in the receive path including the second receive filter (132). Since no filter is disposed on the transmit filter (12), the heat dissipation performance of the transmit filter (12) is enhanced. Additionally, a temperature change of the second receive filter (132), which would be caused by heat dissipation of the transmit filter (12), is less likely to occur. This can reduce variations in the bandpass characteristics of the second receive filter (132) for signals, which would be caused by a temperature change of the second receive filter (132).

In the radio-frequency module (1) according to a second aspect, in the first aspect, the electronic component (40*a*) has a through-via (43). The through-via (43) passes through the first region (41) in the thickness direction (D1) of the mounting substrate (3). The through-via (43) has a first end (431) and a second end (432). The first end (431) of the through-via (43) is connected to the second receive filter (132). The second end (432) of the through-via (43) is connected to the mounting substrate (3) or the first receive filter (131).

In the radio-frequency module (1) according to the second aspect, the through-via (43) of the first electronic component (40*a*) can be used for connecting the second receive filter (132) to the mounting substrate (3) or connecting the second receive filter (132) to the first receive filter (131). This can reduce the length of the path between the second receive filter (132) and another electronic component to be connected to the second receive filter (132). Impedance mismatching between the second receive filter (132) and another electronic component to be connected to each other is thus less likely to occur. As a result, the insertion loss of the second receive filter (132) is less likely to increase or the attenuation characteristics of the second receive filter (132) for a signal in the elimination band are less likely to be degraded.

In the first or second aspect, the radio-frequency module (1*a*, 1*b*) according to a third aspect also includes a third receive filter (133, 134, 135). The radio-frequency module (1*a*, 1*b*) is able to perform simultaneous communication using a signal of a first band which passes through the transmit filter (12) and a signal of a second band which passes through the third receive filter (133, 134, 135). The third receive filter (133, 134, 135) is disposed on the second main surface (32) of the mounting substrate (3).

In the radio-frequency module (1*a*, 1*b*) according to the third aspect, the mounting substrate (3) is interposed between the transmit filter (12) included in the electronic component (40) and the third receive filter (133, 134, 135). Hence, electromagnetic coupling between the transmit filter (12) and the third receive filter (133, 134, 135) can be reduced, thereby enhancing the isolation between the transmit filter (12) and the third receive filter (133, 134, 135). This can make it less likely to degrade the reception sensitivity in the receive path including the third receive filter (133, 134, 135).

In the radio-frequency module (1*a*, 1*b*) according to a fourth aspect, in the third aspect, in a plan view in the thickness direction (D1) of the mounting substrate (3), the second region (42) of the electronic component (40) and the third receive filter (133, 134, 135) do not overlap each other.

In the radio-frequency module (1*a*, 1*b*) according to the fourth aspect, electromagnetic coupling between the transmit filter (12) and the third receive filter (133, 134, 135) can further be reduced, thereby further enhancing the isolation between the transmit filter (12) and the third receive filter (133, 134, 135). This can make it even less likely to degrade the reception sensitivity in the receive path including the third receive filter (133, 134, 135).

In the radio-frequency module (1*a*, 1*b*) according to a fifth aspect, in the third or fourth aspect, the radio-frequency module (1*a*, 1*b*) is able to perform communication using a signal of a third band which passes through the second receive filter (132). The radio-frequency module (1*a*, 1*b*) does not perform simultaneous communication using a signal of the third band and a signal of the first band.

In the radio-frequency module (1*a*, 1*b*) according to the fifth aspect, based on the radio-frequency module (1*a*, 1*b*) receiving a signal by using the second receive filter (132), the radio-frequency module (1*a*, 1*b*) does not send a signal using the transmit filter (12). It is thus possible to reduce electromagnetic coupling between the second receive filter (132) and the transmit filter (12). This can make it less likely to degrade the reception sensitivity in the receive path including the second receive filter (132).

In one of the third through fifth aspects, the radio-frequency module (1*a*, 1*b*) according to a sixth aspect also includes a shield member (197) disposed on the second main surface (32) of the mounting substrate (3). The shield member (197) is located between the third receive filter (133, 134, 135) and the second region (42) of the electronic component (40).

In the radio-frequency module (1*a*, 1*b*) according to the sixth aspect, electromagnetic coupling between the transmit filter (12) and the third receive filter (133, 134, 135) can further be reduced, thereby further enhancing the isolation between the transmit filter (12) and the third receive filter (133, 134, 135). This can make it even less likely to degrade the reception sensitivity in the receive path including the third receive filter (133, 134, 135).

In one of the third through sixth aspects, the radio-frequency module (1*b*) according to a seventh aspect includes plural third receive filters (133, 134, 135). The electronic component (40) is assumed as a first electronic component (40), and the plural third receive filters (133, 134, 135) are included in a second electronic component (54*a*) which is disposed on the second main surface (32) of the mounting substrate (3).

In the radio-frequency module (1*b*) according to the seventh aspect, the size of the radio-frequency module (1*b*) can be reduced.

In the radio-frequency module (1*b*) according to an eighth aspect, in the seventh aspect, the plural third receive filters (133, 134, 135) include a filter that allows a signal of Band 12 of 3GPP LTE standards to pass therethrough, a filter that allows a signal of Band 13 of 3GPP LTE standards to pass therethrough, and a filter that allows a signal of Band 14 of 3GPP LTE standards to pass therethrough.

The radio-frequency module (1*b*) according to the eighth aspect can select a signal of the second band that can be sent together with a signal of the first band from a wider range of bands.

A communication apparatus (10) according to a ninth aspect includes the radio-frequency module (1, 1*a*, 1*b*) according to one of the first through eighth aspects and a signal processing circuit (2). The signal processing circuit (2) is connected to the radio-frequency module (1, 1*a*, 1*b*).

In the communication apparatus (10) according to the ninth aspect, in the radio-frequency module (1, 1*a*, 1*b*), electromagnetic coupling between the transmit filter (12) and the second receive filter (132) can be reduced. This can make it less likely to degrade the reception sensitivity in the receive path including the second receive filter (132). Since no filter is disposed on the transmit filter (12), the heat dissipation performance of the transmit filter (12) is enhanced. Additionally, a temperature change of the second receive filter (132), which would be caused by heat dissipation of the transmit filter (12), is less likely to occur. This can reduce variations in the bandpass characteristics of the second receive filter (132) for signals, which would be caused by a temperature change of the second receive filter (132).

What is claimed is:

1. A radio-frequency module comprising:

a mounting substrate having first and second main surfaces;

an electronic component that includes a transmit filter and a first receive filter and that is disposed on the first main surface of the mounting substrate; and a second receive filter stacked on the electronic component, wherein a pass band of the transmit filter and a pass band of the second receive filter do not exactly match each other, and in a plan view in a thickness direction of the mounting substrate, a first region of the electronic component where the first receive filter is located overlaps or matches the second receive filter, and a second region of the electronic component where the transmit filter is located overlaps none of filters disposed on the first main surface of the mounting substrate.

2. A communication apparatus comprising:

the radio-frequency module according to claim 1; and a signal processing circuit connected to the radio-frequency module.

3. The radio-frequency module according to claim 1, wherein:

the electronic component has a through-via which passes through the first region in the thickness direction of the mounting substrate.

4. The radio-frequency module according to claim 1, wherein:

the second receive filter is in contact with the electronic component and is arranged together with the electronic component along the thickness direction of the mounting substrate.

5. The radio-frequency module according to claim 1, wherein:

the electronic component has a through-via which passes through the first region in the thickness direction of the mounting substrate; and the through-via has a first end and a second end, the first end being connected to the second receive filter, the second end being connected to the mounting substrate or the first receive filter.

6. The radio-frequency module according to claim 5, further comprising:

a third receive filter, wherein the radio-frequency module is able to perform simultaneous communication using a signal of a first band which passes through the transmit filter and a signal of a second band which passes through the third receive filter, and wherein the third receive filter is disposed on the second main surface of the mounting substrate.

7. The radio-frequency module according to claim 6, wherein, in a plan view in the thickness direction of the mounting substrate, the second region of the electronic component and the third receive filter do not overlap each other.

8. The radio-frequency module according to claim 7, wherein:

the radio-frequency module is able to perform communication using a signal of a third band which passes through the second receive filter; and the radio-frequency module does not perform simultaneous communication using a signal of the third band and a signal of the first band.

9. The radio-frequency module according to claim 6, further comprising:

a shield member disposed on the second main surface of the mounting substrate, wherein the shield member is located substantially around the third receive filter.

10. The radio-frequency module according to claim 6, wherein:

the radio-frequency module includes a plurality of the third receive filters; and the electronic component is assumed as a first electronic component, and the plurality of the third receive filters are included in a second electronic component, the second electronic component being disposed on the second main surface of the mounting substrate.

11. The radio-frequency module according to claim 10, wherein the plurality of the third receive filters include a filter that allows a signal of Band 12 of 3GPP LTE standards to pass therethrough, a filter that allows a signal of Band 13 of 3GPP LTE standards to pass therethrough, and a filter that allows a signal of Band 14 of 3GPP LTE standards to pass therethrough.

12. A communication apparatus comprising:

the radio-frequency module according to claim 6; and a signal processing circuit connected to the radio-frequency module.

13. The radio-frequency module according to claim 1, further comprising:

a third receive filter, wherein the radio-frequency module is able to perform simultaneous communication using a signal of a first band which passes through the transmit filter and a signal of a second band which passes through the third receive filter, and wherein the third receive filter is disposed on the second main surface of the mounting substrate.

14. The radio-frequency module according to claim 13, wherein, in a plan view in the thickness direction of the mounting substrate, the second region of the electronic component and the third receive filter do not overlap each other.

15. The radio-frequency module according to claim 14, wherein:

the radio-frequency module is able to perform communication using a signal of a third band which passes through the second receive filter; and the radio-frequency module does not perform simultaneous communication using a signal of the third band and a signal of the first band.

16. The radio-frequency module according to claim 13, further comprising:

a shield member disposed on the second main surface of the mounting substrate, wherein the shield member is located substantially around the third receive filter.

17. The radio-frequency module according to claim 13, wherein:

the radio-frequency module includes a plurality of the third receive filters; and the electronic component is assumed as a first electronic component, and the plurality of the third receive filters are included in a second electronic component, the second electronic component being disposed on the second main surface of the mounting substrate.

18. The radio-frequency module according to claim 17, wherein the plurality of the third receive filters include a filter that allows a signal of Band 12 of 3GPP LTE standards to pass therethrough, a filter that allows a signal of Band 13 of 3GPP LTE standards to pass therethrough, and a filter that allows a signal of Band 14 of 3GPP LTE standards to pass therethrough.

19. The radio-frequency module according to claim 13, wherein:

the radio-frequency module is able to perform communication using a signal of a third band which passes through the second receive filter; and the radio-frequency module does not perform simultaneous communication using a signal of the third band and a signal of the first band.

20. A communication apparatus comprising:

the radio-frequency module according to claim 13; and a signal processing circuit connected to the radio-frequency module.

* * * * *